US005751747A

United States Patent [19]
Lutes et al.

[11] Patent Number: 5,751,747
[45] Date of Patent: May 12, 1998

[54] LINEAR SWEPT FREQUENCY GENERATOR

[75] Inventors: George F. Lutes, Glendale; Xiaotian Steve Yao, Diamond Bar, both of Calif.

[73] Assignee: California Institute of Technology, Pasadena, Calif.

[21] Appl. No.: 575,381

[22] Filed: Dec. 20, 1995

[51] Int. Cl.[6] .................................................. H03L 7/24
[52] U.S. Cl. .......................... 372/2; 331/4; 372/24; 372/38; 385/12
[58] Field of Search .................... 331/4; 385/12, 385/13; 372/9, 20–25, 28, 29, 32, 33, 38

[56] References Cited

U.S. PATENT DOCUMENTS

| 4,647,873 | 3/1987 | Beckner et al. | 331/4 |
| 4,649,529 | 3/1987 | Avicola | 385/12 X |
| 4,775,214 | 10/1988 | Johnson | 385/12 |

OTHER PUBLICATIONS

Electronics Letters, vol. 30, No. 18, 1 Sep. 1994:pp. 1525–1526, "High frequency optical subcarrier generator," X.S. Yao and L. Maleki.

TDA Progress Report 42–121, 15 May 1995:pp. 202–210, "A High–Speed Photonic Clock and Carrier Regenerator," X.S. Yao and G. Lutes.

Primary Examiner—John D. Lee
Attorney, Agent, or Firm—Fish & Richardson P.C.

[57] ABSTRACT

A linear swept frequency generator includes a signal generator that generates an output signal having a frequency that varies between a first frequency and a second frequency. A delay element, such as an optical fiber having a reflector at one end, is configured to receive the output signal and to produce a delayed version of the output signal. This delayed version of the output signal is provided, along with the output signal, to a mixer that combines the signals to produce a reference signal. Finally, a feedback path between the mixer and the signal generator provides the reference signal to the signal generator so that the signal generator controls the frequency of the output signal in response to the reference signal.

31 Claims, 4 Drawing Sheets

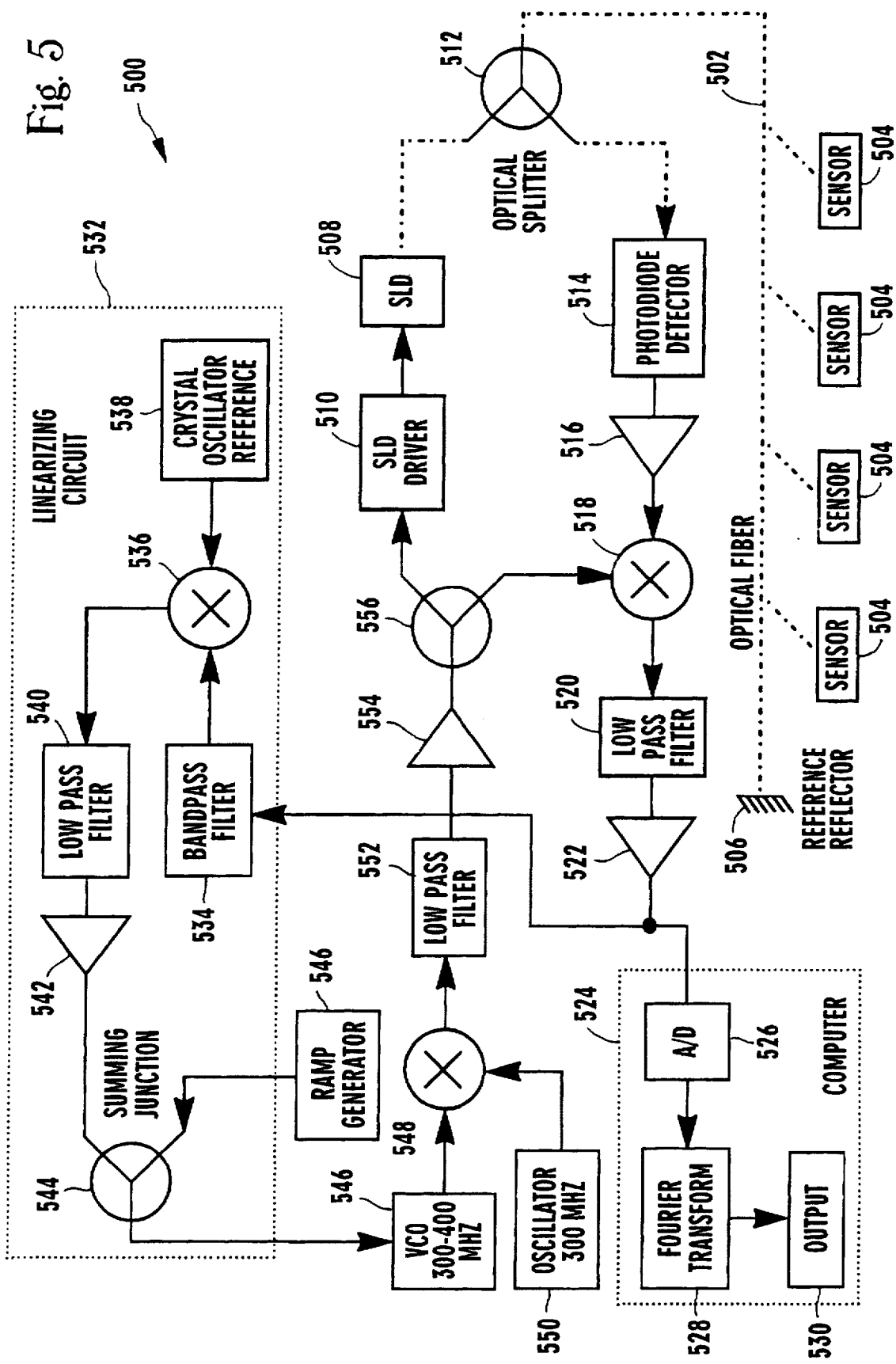

LINEAR SWEPT FREQUENCY GENERATOR

ORIGIN OF INVENTION

The invention described herein was made in the performance of work under a NASA contract, and is subject to the provisions of Public Law 96-517 (35 USC 202) in which the Contractor has elected to retain title.

BACKGROUND AND SUMMARY OF THE INVENTION

Swept frequency signals are used in a variety of applications, including, for example, chirp radar. A swept frequency signal has a constant amplitude and a frequency that varies across a range of frequencies. Typically, the frequency of the signal starts at the first frequency and steadily increases until it reaches the second frequency. The frequency then decreases, usually at the same rate, until it reaches the first frequency. This increase-decrease cycle is repeated. The time required for the frequency to vary between the first and second frequencies is defined as a sweep period. The rate of variation, or sweep rate, is defined as the difference between the first frequency and the second frequency divided by the sweep period. The frequency sweep is said to be linear when the sweep rate has a constant value throughout the sweep period.

The inventors realized that traditional approaches to generating swept frequency signals were ineffective in generating highly linear sweeps (i.e., signals having constant or near constant sweep rates), particularly at high frequencies such as radio frequencies (RF), microwave frequencies, and optical frequencies. The inventors also realized that nonlinearities were particularly problematic when the frequency was to be swept over a large frequency range.

To obviate these problems, the inventors developed a system capable of generating an extremely linear swept frequency over a very wide frequency range for RF, microwave and optical frequencies. The system employs a feedback loop to lock the sweep of a sweep generator to a low-noise stable frequency reference. The feedback loop includes a delay, such as a high-Q, low-loss, low-noise and wide-bandwidth optical delay line, and produces a measure of the linearity of a swept frequency signal that is used to correct nonlinearities in the sweep of a swept frequency signal. The linearity of the swept frequency signal is limited only by the stability of the low-noise frequency reference. The system can linearize swept frequency optical signals over a terahertz frequency range.

The optical delay line is used to generate a fixed low frequency signal that is directly related to the sweep rate of a swept frequency signal and can be locked to the low-noise frequency reference. The swept frequency signal is supplied as an input to the optical delay line, and the difference in phase between the input and output of the optical delay line is obtained using a phase detector. The measured phase changes approximately linearly with time during the swept period and can be expressed as an output frequency. If the delay and the output frequency are constant, then the slope must also be constant. Accordingly, the slope may be maintained at a constant value by using the feedback loop to maintain the output frequency at a constant value.

The inventors also realized that the highly linear swept frequency generator could be used, for example, in systems such as a sensor querying system. Typically, sensor querying systems direct pulses of light into an optical fiber having sensors positioned at various points along its length. Each sensor reflects a level of light that is related to a value sensed by the sensor. Accordingly, values sensed by the sensors may be determined by monitoring light pulses reflected by the sensors and produced at an output of the optical fiber. The reflected pulse of light from each sensor is separated from the reflected pulses of light from the other sensors by time.

For the light pulse approach to work properly, the pulses must be short enough and the sensor elements must be far enough apart so that the reflected pulses do not overlap. This places restrictions on places where the sensors may be placed along the optical fiber. If any two sensor elements are placed too close together, the pulses of light would have to be correspondingly shorter. However, shorter pulses have less energy and, therefore, are harder to detect.

The sensitivity and dynamic range of a detection system may be increased by averaging. However, long averaging times are undesirable in sensing systems requiring real-time measurements, such as those used in process control.

The present inventors have developed a new approach which uses a swept frequency signal. The signal has an extremely linear sweep for the purpose of reducing interference between sensor readouts. With the exception that no two sensors may be positioned at the same distance from the end of the fiber, there are no restrictions on sensor placement. The inventors found that the swept frequency signal supplies substantially more energy to the fiber than do light pulses. This means that less averaging time is required to obtain a level of sensitivity comparable to a light pulse system. Accordingly, output from the system may be in real time or near real-time.

The swept frequency system has a greater dynamic range for a given peak optical power than does a light pulse system. In lossy systems, a light pulse system requires more averaging to improve sensitivity and dynamic range than does a swept frequency system. For systems requiring averaging, the light pulse approach will always require longer averaging times than the swept frequency system for equal levels of sensitivity.

Other features and advantages of the invention will become apparent from the following detailed description of the preferred embodiments, including the drawings, and from the claims.

BRIEF DESCRIPTION OF THE DRAWINGS

FIG. 5 is a block diagram of an implementation of an optical sensor querying system.

DESCRIPTION OF THE PREFERRED EMBODIMENTS

Figure 1:
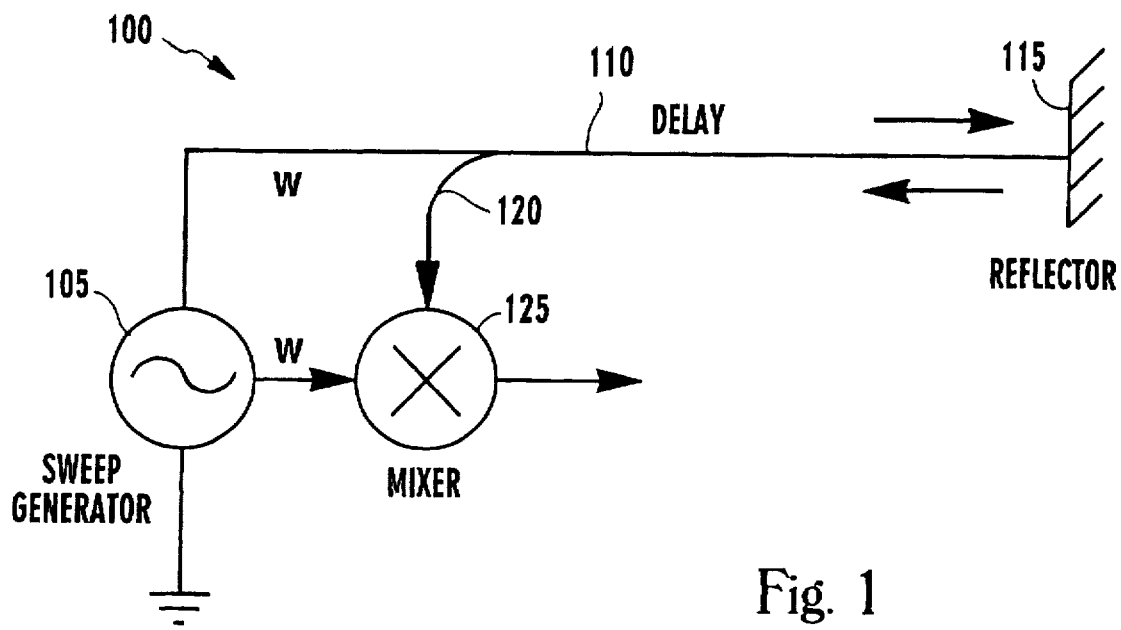
FIG. 1 is a block diagram of a system for generating a baseband output.

FIG. 1 shows a system 100 which may be used to measure the linearity of frequency change in a swept frequency signal produced by a sweep generator 105. The swept frequency signal is applied to a delay such as an optical fiber 110 having a reflector 115 at the far end thereof. When frequencies of the swept frequency signal are optical frequencies, the signal is applied directly to the fiber. (The "applying" is intended to be generic to these and all other ways of applying the signal to the fiber.) When the frequencies of the swept frequency signal are radio frequencies or microwave frequencies, the signal is used to amplitude modulate an optical carrier signal that is then applied to the fiber. The phase of the signal applied to the fiber (the input signal) can be described by:

$$\phi_{in} = \int_0^t (\omega_o + \alpha t) dt = \omega_o t + \frac{1}{2} \alpha t^2 \qquad (1)$$

where $\omega_o$ is the starting frequency, t is the time, and $\alpha$ is the sweep rate ($d\omega/dt$).

The swept frequency signal travels through the optical fiber 110, is reflected by the reflector 115 and returns through the optical fiber 110. An output signal produced at an output 120 of the optical fiber is a delayed version of the swept frequency signal. The phase of the output signal is:

$$\begin{aligned}\phi_{out} &= \int_0^{t+\tau} (\omega_o + \alpha t) dt = \omega_o (t+\tau) + \frac{1}{2} \alpha (t+\tau)^2 \\ &= \omega_o t + \frac{1}{2} \alpha t^2 + \omega_o \tau + \frac{1}{2} \alpha \tau^2 + (\alpha \tau) t\end{aligned} \qquad (2)$$

where $\tau$ is the delay between the input and the output of the optical fiber 110.

The swept frequency signal (the input signal) and the delayed version thereof (the output signal) are supplied to a mixer 125 that produces a baseband signal corresponding to the difference between the input signal and the output signal. As an alternative, an inverted version of the swept frequency signal may be supplied to the mixer, and the mixer may sum the delayed and inverted versions of the signals. The difference in phase between the input signal and the output signal is:

$$\Delta\phi(t) = \phi_{out} - \phi_{in} = \omega_o \tau + \frac{1}{2} \alpha \tau^2 + (\alpha \tau) t. \qquad (3)$$

By removing the fixed terms (i.e., the terms that do not depend on time) and assuming that the frequency of the signal produced by the sweep generator changes linearly with time, the baseband output signal can be expressed as having a frequency $\omega'$ corresponding to the change in the phase difference with respect to time:

$$\omega' = \frac{d(\Delta\phi)}{dt} = \alpha \tau. \qquad (4)$$

Because the delay $\tau$ is constant, variations in $\omega'$ correspond to variations in the sweep rate ($d\omega/dt$) of the swept frequency signal (i.e., to non-linearities in the sweep). Similarly, a constant $\omega'$ means that the sweep rate ($d\omega/dt$) is constant and the sweep is linear.

It is apparent that $\omega'$ can be controlled by controlling the sweep rate ($d\omega/dt$) of the swept frequency signal. If means for changing $d\omega/dt$ with an applied voltage is added to the system, it can be modelled as a black box with an output frequency that is controlled by an input control voltage (i.e. as a voltage controlled oscillator). Since the system acts like a voltage controlled oscillator, it can be locked to a stable external frequency reference using standard phase locked loop design methods. Once locked to the external frequency reference, the output frequency $\omega'$ is stable, which indicates that the sweep rate is forced to be constant, and that the sweep is forced to be linear.

Figure 2:
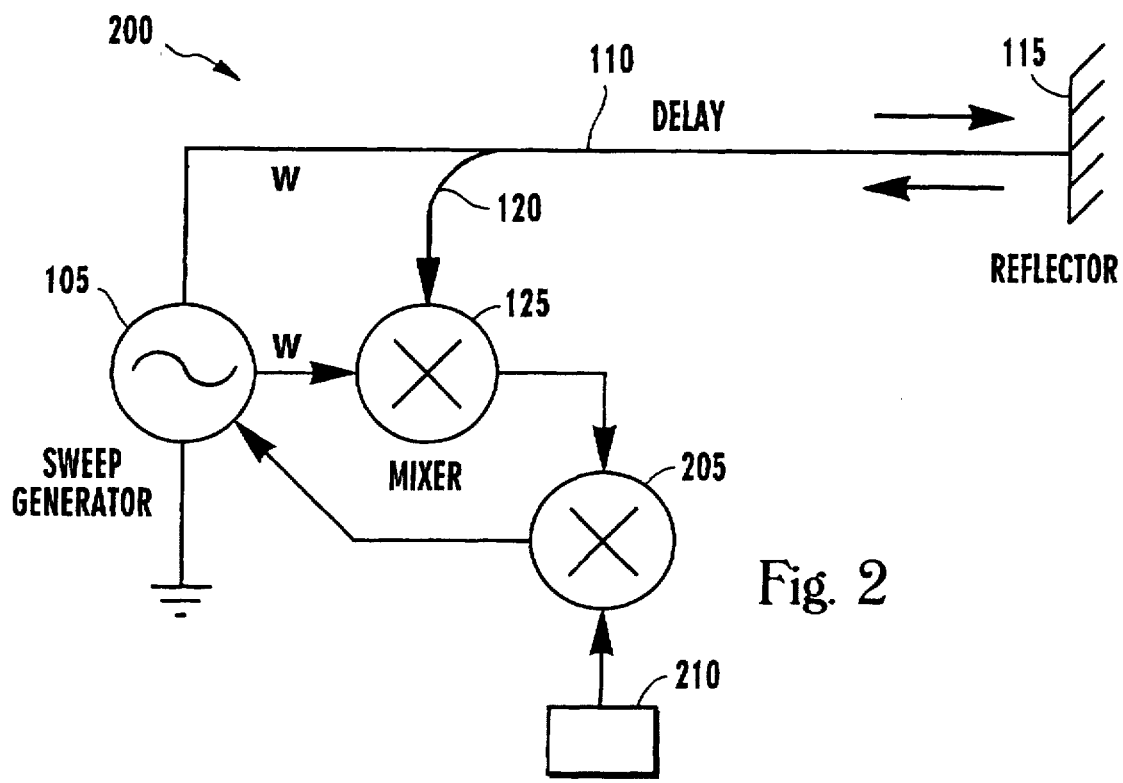
FIG. 2 is a block diagram of a linear swept frequency generator.

FIG. 2 shows a system 200 for producing a swept frequency signal having a constant sweep rate (i.e., a linear sweep). In system 200, the output of the mixer 125, which is an alternating current ("AC") signal is supplied to a first input of a mixer 205. A second input to the mixer 205 is supplied by a reference frequency generator 210. The mixer 205 combines the two input signals to produce a direct current ("DC") output signal that is supplied to the sweep generator 105 as a feedback signal. The sweep generator 105 is responsive to the feedback signal to adjust the swept frequency signal to maintain $\omega'$ at a constant, desired value which thereby forces the sweep to be linear.

Figure 3:
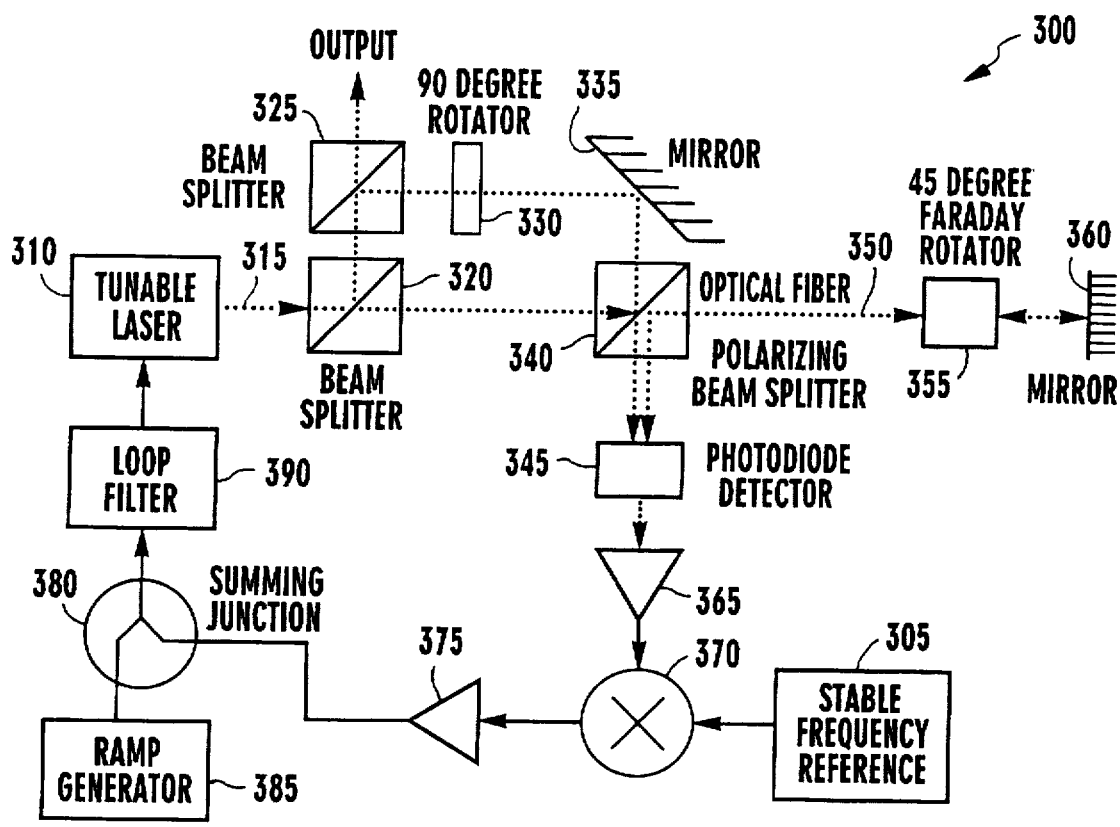
FIG. 3 is a block diagram of an implementation of a swept frequency generator.

An implementation 300 in which the output frequency $\omega'$ is maintained at a constant value by phase-locking the output signal to a fixed frequency reference 305 is shown in FIG. 3. In implementation 300, a tunable laser 310 is controlled to produce a swept frequency output signal 315 having a linear sweep rate. For example, the output signal 315 may sweep a frequency range on the order of one teraHertz ($10^{12}$ Hertz) in a sweep period that is 30 to 40 microseconds in duration so that the sweep rate is on the order of $3*10^{16}$ Hertz/second. The frequency of the output signal produced by the tunable laser 310 (which corresponds to the output signal 315 of the implementation 300) is controlled by a voltage supplied to an input of the tunable laser. Because the frequency is not linearly related to the input voltage, a feedback loop is employed to control the input voltage in a way that produces an output signal having a linear sweep rate with a desired sweep range and period.

Initially, the signal produced by the tunable laser 310 is provided to optics that produce the output signal 315 and provide signals to the feedback loop. A first beam splitter 320 reflects a first portion of the signal and passes a second portion of the signal. The first portion of the signal is provided to a second beam splitter 325 that passes a third portion of the signal (corresponding to the output signal 315) and reflects a fourth portion of the signal that passes through a ninety degree rotator 330 before reflecting from a mirror 335, passing through a polarizing beam splitter 340, and illuminating a photodiode 345. The second portion of the signal passes through the polarizing beam splitter 340 and enters an optical fiber 350.

At the far end of the optical fiber 350, a forty-five degree faraday rotator 355 and a mirror 360 reflect light from the optical fiber so that the light returns through the fiber. The optical fiber 350, rotator 355 and mirror 360 produce a signal that is delayed relative to the input signal. The delay may be on the order of 5–10 microseconds.

Light exiting the optical fiber 350 is reflected by the polarizing beam splitter 340 and illuminates the photodiode 345. Because the photodiode is illuminated by the signal from the tunable laser 310 and the signal from the optical fiber 350, the photodiode serves to combine the two signals and to produce an output signal comparable to the signal produced by the mixer 125 of FIGS. 1 and 2.

The output of the photodiode 345 is supplied to an amplifier 365 having an output connected to a first input of a phase detector 370. An output of the fixed frequency reference 305, which typically has a frequency on the order of 10–100 MHz, is connected to a second input of the phase detector 370. In response to the two input signals, the phase detector 370 produces an output signal which has a value that varies with variations in the sweep rate and is constant when the sweep rate is constant (i.e., when the sweep is linear). This output signal is amplified by an amplifier 375 before being supplied to an input of a summing junction 380.

An amplitude ramp generator 385 produces a triangular wave signal having a frequency that corresponds to the desired sweep rate. This signal is supplied to an input of the summing junction 380. The output of the summing junction 380 passes through a low-pass filter 390 before being supplied as the control signal for the tunable laser 310. The low pass filter removes high frequency components of the control signal and serves to increase the stability of the system.

If the relationship between the output of the tunable laser 310 and the control signal was totally linear, the feedback loop would not be required and the output of the amplitude ramp generator 385 would be supplied directly to the tunable laser 310 as a control signal. However, as noted above, the relationship is not entirely linear, and the feedback loop serves to correct for the nonlinearities. When nonlinearities cause the frequency of the output of the tunable laser 310 to increase at a rate greater than the frequency of the signal produced by the ramp generator 385, the amplitude of the signal produced by the amplifier 375 decreases. This results in a decrease in the rate of change of the control signal supplied to the tunable laser 310 and a corresponding correction to the sweep rate of the output of the tunable laser 310. Similarly, when nonlinearities cause the frequency of the output of the tunable laser 310 to increase at a rate that is less than the frequency of the signal produced by the ramp generator 385, the amplitude of the signal produced by the amplifier 375 increases, which results in corresponding decreases in the rate of change of the control signal supplied to the tunable laser 310 and in the sweep rate of the output of the tunable laser 310.

Figure 4:
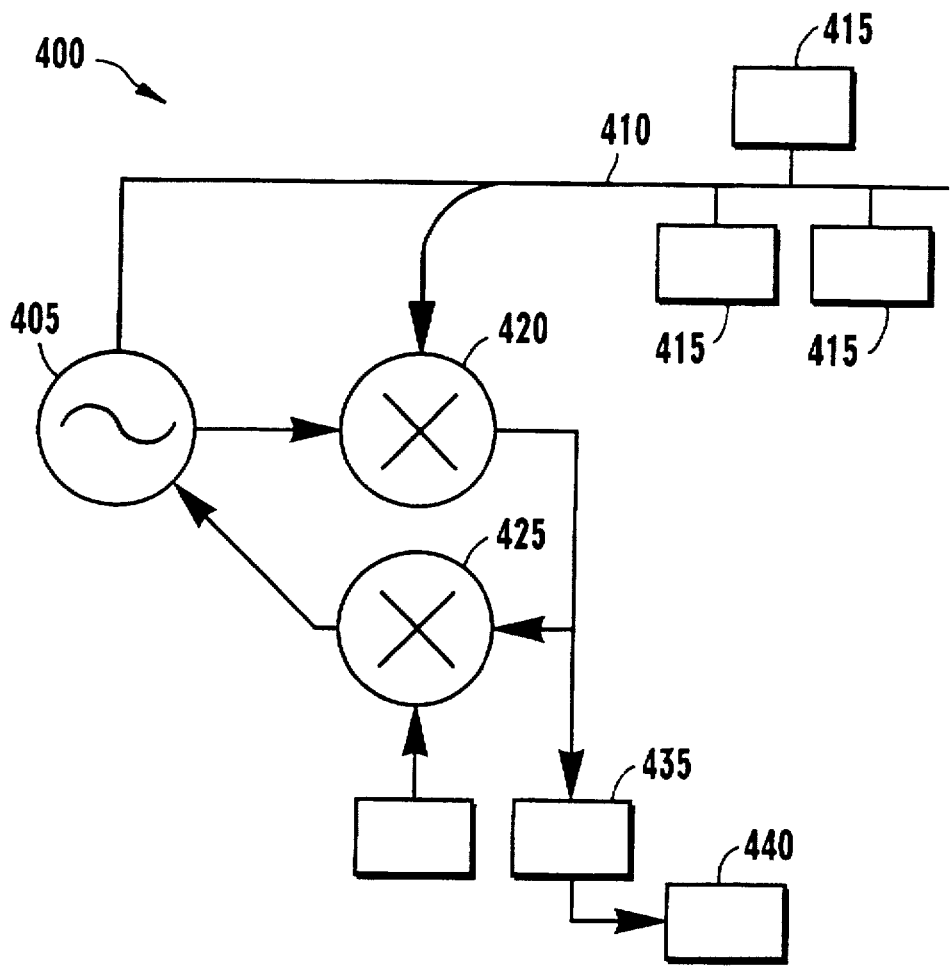
FIG. 4 is a block diagram of an optical sensor querying system.

FIG. 4 illustrates an optical sensor querying system 400 that employs a linear swept frequency generator 405 and an optical fiber 410. A swept frequency signal produced by the generator 405 is applied to the input of the optical fiber 410. This signal can be in the form of RF or microwave modulation on an optical carrier, or it can an unmodulated optical signal. Absorptive or reflective sensor elements 415 are placed along the length of the optical fiber 410. The signal supplied to the optical fiber 410 and the signal reflected from the optical fiber 410 are combined by a mixer 420 to produce a signal that is supplied to the first input of a mixer 425. A second input to the mixer 425 is supplied by a reference frequency generator 430. The mixer 425 combines the two input signals to produce an output signal that is supplied to the sweep generator 405 as a feedback signal for the purpose of correcting nonlinearities in the sweep of the swept frequency signal. In addition, a detector 435 detects the output of mixer 420. Using this dectected signal, a processor 440 produces a measurement of the optical power reflected by each sensor element 415.

A signal having a frequency $\omega'$ results from detecting the phase difference between the input and the output of a delay line having a single reflector at its end when a signal that is linearly swept in frequency is applied to the delay line. When multiple sensors (i.e., multiple reflectors) are present, the total reflected signal $S_r$ can be described by:

$$S_r = \sum_{n=1}^{N} A_n \sin(\omega t + \omega \tau_n) \tag{5}$$

where n identifies the nth sensor, N is the total number of sensors, $A_n$ is the amplitude of the reflection from the nth sensor, and $\tau_n$ is the round trip delay time to and from the nth sensor.

Using the mixer 420 to multiply the total reflected signal $S_r$ by the input signal $\sin(\omega t)$ results in an output signal $S_{out}$ having the value:

$$S_{out} = \sin(\omega t) \sum_{n=1}^{N} A_n \sin(\omega t + \omega \tau_n).$$

Applying a low pass filter to $S_{out}$ results in a modified output signal $S'_{out}$:

$$S'_{out} = \frac{1}{2} \sum_{n=1}^{N} A_n \cos \omega \tau_n \tag{6}$$

Since the frequency $\omega$ is being swept, it can be expressed as:

$$\omega = \omega_o + \alpha t$$

where, $\omega_o$ is the starting frequency and $\alpha$ is the rate of change of the input frequency ($d\omega/dt$). Using this expression, the expression for $S'_{out}$ can be rewritten as:

$$S'_{out} = \frac{1}{2} \sum_{n=1}^{N} A_n \cos(\omega_o \tau_n + \alpha t \tau_n) \tag{7}$$

where $\alpha \tau_n$ is a baseband frequency for the nth sensor and is a function of the sweep rate and the delay for the nth sensor. This expression may be rewritten further as:

$$S'_{out} = \frac{1}{2} \sum_{n=1}^{N} A_n \cos(\omega_o \tau_n + \omega'_n t) \tag{8}$$

where $\omega_o \tau_n$ is a constant phase term that may be ignored, and $\omega_n'$ equals $\alpha \tau_n$.

Using a Fourier transform, the processor 440 converts $S'_{out}$ to a spectrum of baseband frequencies, each of which is related to a reflection. The amplitude of the nth frequency is a direct measure of the magnitude of the optical signal coming from the nth reflection. If the sweep rate is known, each baseband frequency can be used to determine precisely the delay to its related sensor.

The Fourier transform is a spectrum of signals. The frequency of each signal is related to the round trip delay for one of the sensors and the amplitude of each signal is related to the reflection from its respective sensor. In terms of voltage, the Fourier transform is:

$$E(f) = \frac{1}{2} \sum_{n=1}^{N} \frac{A_n}{2} [e^{j\psi_n}\delta(f-f_n) + e^{-j\psi_n}\delta(f+f_n)] \tag{9}$$

where $\psi_n$ equals $\omega_o \tau_n$. In terms of power, this becomes:

$$P(f) = |V(f)|^2 = \frac{1}{4} \sum_{n=1}^{N} A_n^2 [\delta(f-f_n)] \tag{10}$$

More generally, however, any aspect of the signal which improves the output signal can be used. The control is not limited to phase.

FIG. 5 illustrates a particular implementation of a sensor querying system 500 that includes an optical fiber 502 to which are attached multiple sensors 504. A reference reflector 506 is attached to the end of the optical fiber 502. The reference reflector 506 provides a reference signal used in linearization of the sweep of the swept frequency signal.

In the system 500, the swept frequency signal is an optical signal that is amplitude modulated by an RF signal. In particular, the swept frequency signal is an optical signal produced by a super-luminescent diode (SLD) 508 in response to an RF voltage signal from an SLD driver 510. The swept frequency signal is supplied to the optical fiber 502 through an optical splitter 512.

A laser having an appropriate linewidth may be substituted for the SLD. For example, a laser having a linewidth greater than 0.04 nm could be used when sensors are to be spaced a meter or more away from each other. (If the laser were to have a linewidth of less than 0.04 nm, then signals from sensors that were spaced less than a meter from each other would tend to interfere with each other.)

Within the optical fiber 502, the swept frequency signal is reflected by the sensors 504 and the reference reflector 506. The reflected signal exits the optical fiber 502 through the optical splitter 512 and illuminates a photodiode detector 514. An amplifier 516 amplifies the output of the detector 514 and provides it to a mixer 518 that combines the signal with a voltage corresponding to the RF voltage supplied to the SLD driver 510. The output of the mixer 518 is provided to a low pass filter 520, as discussed above. The output of the low pass filter 520 is amplified by an amplifier 522 before being supplied to a computer 524.

Within the computer 524, an analog-to-digital converter 526 converts the amplified output signal to a digital signal. A processor 528 then performs a Fourier transform on the digital signal to produce spectral lines for each sensor. Finally, values of these lines are supplied to an output device 530.

The signal produced by the amplifier 522 is also provided to a linearizing circuit 532 that serves to linearize the sweep of the signal supplied to the optical fiber 502. Within the linearizing circuit, a bandpass filter 534 removes components of the signal that do not correspond to the reference reflector 506. The filtered signal is supplied as the first input to a phase detector 536. The second input of the phase detector 536 is provided by crystal oscillator reference 538 that produces a fixed frequency signal. In response to the two input signals, the phase detector 536 produces an output signal which has a value that varies with variations in the sweep rate and is constant when the sweep rate is constant (i.e., when the sweep is linear). This output signal passes through a low pass filter 540 and an amplifier 542 before being supplied to a first input of a summing junction 544. An amplitude ramp generator 546 produces a signal having a frequency that corresponds to the desired sweep rate and provides it to a second input of the summing junction 544.

The output of the summing junction 544 is provided as the control signal for a voltage controlled oscillator (VCO) 546. In response to the control signal, the VCO produces an output signal having a frequency that varies between 300 MHz and 400 Mhz. A mixer 548 combines this signal with a 300 MHz signal produced by an oscillator 550 to produce a signal having a frequency that varies between 0 and 100 Mhz. This signal is supplied to a low pass filter 552 that removes any components having frequencies greater than 100 MHz. The filtered signal is amplified by an amplifier 554 and supplied to the SLD driver 510 and the mixer 518 through a summing junction 556.

Other embodiments are within the following claims.

What is claimed is:

1. A linear swept frequency generator comprising:
    a signal generator operable to generate an output signal having a frequency that sweeps between a first frequency and a second frequency;
    a delay element configured to receive the output signal and operable to produce a delayed version of the output signal;
    a mixer configured to receive the output signal and the delayed output signal and operable to combine the output signal and the delayed output signal to produce a reference signal indicative of a difference therebetween; and
    a feedback path between the mixer and the signal generator, receiving a fixed frequency reference signal and operable to produce a control signal according to the fixed frequency reference signal and the reference signal;
    wherein the signal generator controls an aspect of the frequency of the output signal in response to the control signal.

2. The linear swept frequency generator of claim 1, wherein the delay element is an optical fiber.

3. The linear swept frequency generator of claim 2, further comprising a reflector positioned at one end of the optical fiber.

4. The linear swept frequency generator of claim 2, wherein the signal generator comprises a tunable laser configured to produce the output signal as an optical signal.

5. The linear swept frequency generator of claim 2, wherein the signal generator comprises a luminescent diode.

6. The linear swept frequency generator of claim 2, wherein the output signal and the delayed output signal are optical signals, and wherein the mixer comprises a photodiode operable to produce the reference signal as a voltage corresponding to light that is incident on the photodiode from the output signal and from the delayed output signal.

7. The linear swept frequency generator as in claim 1, wherein the signal generator is phase locked to the fixed frequency reference signal via the feedback path.

8. The linear swept frequency generator as in claim 1, further comprising an additional mixer in the feedback path for producing the control signal by combining the reference signal and the fixed frequency reference signal.

9. A system for measuring sweep linearity of a swept frequency signal, comprising:
    an optical delay element configured to receive a swept frequency signal having a frequency that varies between a first frequency and a second frequency, and to produce a delayed version of the swept frequency signal; and
    a mixer configured to receive the swept frequency signal and the delayed version of the swept frequency signal and operable to combine the swept frequency signal and the delayed version of the swept frequency signal to produce a reference signal indicative of a linearity at which the frequency of the swept frequency signal varies from the first frequency to the second frequency.

10. The system of claim 9, wherein the optical delay element is an optical fiber.

11. The system of claim 10, further comprising a reflector positioned at one end of the optical fiber.

12. The system of claim 9, wherein the swept frequency signal and the delayed version of the swept frequency signal are optical signals, and wherein the mixer comprises a photodiode operable to produce the reference signal as a voltage corresponding to light that is incident on the photodiode from the swept frequency signal and from the delayed version of the swept frequency signal.

13. The system as in claim 9, further comprising:
    a frequency reference device, producing a fixed frequency reference signal; and
    an additional mixer connected to both the mixer and the frequency reference device, the additional mixer comparing the linearity based on a property of the fixed frequency reference signal.

14. The system as in claim 13, further including a feedback loop to phase lock the swept frequency signal to the fixed frequency reference signal.

15. A sensor querying system comprising:
    an optical fiber;

at least one sensor positioned along the optical fiber and configured to reflect light at a level corresponding to a value sensed by the at least one sensor;

a signal generator operable to generate a swept frequency signal having a frequency that varies between a first frequency and a second frequency and configured to provide the swept frequency signal to the optical fiber;

a mixer configured to receive the swept frequency signal and a signal produced by the optical fiber in response to the swept frequency signal, and operable to combine the swept frequency signal and the signal produced by the optical fiber to produce an output signal; and a processor configured to receive the output signal and operable to produce a measure of the value sensed by the at least one sensor in response thereto.

16. The sensor querying system of claim 15, further comprising a feedback path between the mixer and the signal generator, wherein the signal generator controls the frequency of the swept frequency signal in response to the output signal.

17. The system of claim 16, further comprising a reflector positioned at one end of the optical fiber.

18. The system of claim 17, wherein the feedback path includes a filter operable to isolate a portion of the output signal that corresponds to light reflected by the reflector and to provide the isolated portion to the signal generator for use in controlling the frequency of the swept frequency signal.

19. The system as in claim 16, further comprising a frequency reference device connected to the feedback path for producing a fixed frequency reference signal, and wherein the signal generator is phase locked to the fixed frequency reference signal.

20. The sensor querying system of claim 15, wherein the at least one sensor includes a first sensor and a second sensor, and wherein the processor is operable to produce, in response to the output signal, a measure of a value sensed by the first sensor and a measure of a value sensed by the second sensor.

21. The sensor querying system of claim 20, wherein the processor is operable to perform a Fourier transform on the output signal and to produce the measures of the values sensed by the first and second sensors based on results of the Fourier transform.

22. A method of producing a signal having a frequency that linearly sweeps from a first frequency to a second frequency, comprising:

generating an output signal having a frequency that varies between the first frequency and the second frequency;

generating a delayed version of the output signal;

combining the output signal and the delayed output signal to produce a reference signal;

producing a control signal by correlating the reference signal and a fixed frequency reference signal; and controlling the frequency of the output signal using the control signal.

23. The method of claim 22, wherein the step of generating a delayed version of the output signal comprises generating the delayed version of the output signal using an optical fiber.

24. The method as in claim 22, wherein the step of controlling includes phase locking the output signal to the fixed frequency reference signal.

25. A method of measuring sweep linearity of a swept frequency signal, comprising:

producing a optically delayed version of a swept frequency signal having a frequency that varies between a first frequency and a second frequency; and combining the swept frequency signal and the delayed version of the swept frequency signal to produce a reference signal indicative of the linearity at which the frequency of the swept frequency signal varies from the first frequency to the second frequency.

26. The method of claim 25, wherein the step of producing a delayed version of the swept frequency signal comprises generating the delayed version of the swept frequency signal using an optical fiber.

27. The method as in claim 25, further comprising phase locking the swept frequency signal to a stable frequency reference.

28. A method of measuring a value sensed by at least one sensor that is positioned along an optical fiber and configured to reflect light at a level corresponding to the value sensed by the sensor, comprising:

generating a swept frequency signal having a frequency that varies between a first frequency and a second frequency;

providing the swept frequency signal to the optical fiber;

combining the swept frequency signal and a signal produced by the optical fiber in response to the swept frequency signal to produce an output signal; and producing a measure of the value sensed by the at least one sensor in response to the output signal.

29. The method of claim 28, further comprising controlling the frequency of the swept frequency signal in response to the output signal.

30. The method of claim 29, further comprising:

isolating a portion of the output signal that corresponds to light reflected by a reflector positioned at one end of the optical fiber; and controlling the frequency of the swept frequency signal in response to the isolated portion of the output signal.

31. The method as in claim 28, further comprising:

producing a fixed frequency reference signal; and phase locking the swept frequency signal to the fixed frequency reference signal.

* * * * *